United States Patent [19]

DiPaolo et al.

[11] Patent Number: 5,397,598
[45] Date of Patent: Mar. 14, 1995

[54] METHOD FOR SELECTIVELY COATING A MEMBER HAVING A SHANK BY MASKING A PORTION OF THE SHANK WITH A WASHER

[75] Inventors: Nunzio DiPaolo, Poughkeepsie; Balaram Ghosal, Fishkill; Kim H. Ruffing, Briarcliff Manor, all of N.Y.

[73] Assignee: International Business Machines Corporation, Armonk, N.Y.

[21] Appl. No.: 150,296

[22] Filed: Nov. 12, 1993

[51] Int. Cl.[6] .......................... B05D 1/32; C25D 5/02
[52] U.S. Cl. ...................................... 427/282; 427/98; 427/123; 427/125; 205/135
[58] Field of Search ................. 427/98, 123, 125, 265, 427/282, 287; 205/122, 125, 126, 134, 135, 136

[56] References Cited

U.S. PATENT DOCUMENTS

| 3,393,597 | 7/1968 | Hoaglund | 205/135 |
| 4,518,636 | 5/1985 | Richards | 205/135 |

FOREIGN PATENT DOCUMENTS

| 28 11 596 | 5/1979 | Germany | 205/135 |
| 1539260 | 1/1979 | United Kingdom | 205/135 |
| 2097426 | 11/1982 | United Kingdom | 205/136 |

*Primary Examiner*—Terry J. Owens
*Attorney, Agent, or Firm*—Aziz M. Ahsan

[57] ABSTRACT

A member having a shank is selectively coated with a material such as a metal by loosely sliding a washer made of a material such as a thermoplastic or thermosetting polymer onto the shank, securing the washer such that the washer is in intimate contact with the shank, and immersing at least a portion of the member into at least one coating bath so that a portion of the member is coated and the portion of the shank in contact with the washer is not coated. The member can be an input/output pin for an electronic device and the coating can be applied by methods such as electroless plating or electrolytic plating.

12 Claims, 1 Drawing Sheet

METHOD FOR SELECTIVELY COATING A MEMBER HAVING A SHANK BY MASKING A PORTION OF THE SHANK WITH A WASHER

FIELD OF THE INVENTION

The present invention relates generally to a new method for selectively coating or plating a member and members coated or plated thereby. More particularly, the invention encompasses a method of masking a selected area with a non-wettable material, such as an organic or an inorganic material, which material is secured or held by inherent compressive forces against the selected area of the member so that area after the coating or plating operation is free from the coating or plating material.

BACKGROUND OF THE INVENTION

Input/Output (I/O) pins for electronic applications are typically attached to a semiconductor substrate, such as a ceramic substrate, using solder or braze, such as, for example, tin-antimony (SnSb) solder. In most cases tin-antimony solder can be used only with specially designed pins which have selective metal plating on the surface or base of the pins. The selective plating is an important factor as it limits the solder or braze to wet only the base and preferably the tapered portion of the pin (if the pin has a tapered portion) and not the shank of the pin. On the other hand, for some applications, a solder or braze wettable material, such as gold (Au), is required on critical area of shank for connection to board, and on the pin head, i.e., on the tapered side and the base of the pin, to obtain an ideal solder fillet shape.

One problem with the currently used I/O pins that are secured to the semiconductor substrate is that they have a poor solder fillet shape, as more clearly seen in FIG. 1, where an I/O pin 15, having a stem or shank 19, and a pin head 17, is secured to a bonding pad 12, on a semiconductor substrate 10, using a braze or solder material 14. In this case there is no solder or braze material on the tapered side of the pin head 17, and therefore the pin 15, cannot take the stresses as required for such pins and as more clearly discussed in U.S. Pat. No. 4,970,570, assigned to the assignee of the present invention and incorporated herein by reference.

Another problem that has been noticed with some of the currently used I/O pins, is that they are either made of a material that is wettable by solder or braze. Or that both the shank and the tapered side of the I/O pin head have a coating of gold. This could be as a result of either a coating of residual gold or the presence of a continuous gold layer. Solder run-up may thus occur, as more clearly shown in FIG. 2, where the solder or braze material 14, can be seen not only on the tapered side of the pin head 17, but also along portions of the shank 19. This creates more stresses and failure conditions for the pin 15.

One method of selectively electroplating gold on metallic surfaces containing copper using a chromate film as a plating mask is disclosed in U.S. Pat. No. 4,077,852. Prior to putting down the chromate mask or film certain areas may be masked by use of organic films such as stop-off lacquer or photoresist material.

Another process of selective plating is disclosed in U.S. Pat. No. 4,199,415, where a metal surface which will be selectively plated with a precious metal, includes the steps of producing a removable mask on the metal surface to be plated, which mask covers the area to be plated, and electroplating the metal surface in an electrolytic bath with an organic resin paint, such that the paint covers the portion of the metal surface not covered by said removable mask, removing the removable mask so as to leave the area to be plated with the precious metal exposed, and electro-plating the exposed area of the metal surface with the precious metal.

U.S. Pat. No. 4,280,882, discloses another method for electroplating selected areas of article and articles plated thereby. This Patent also teaches that the movement of an electrolyte up the surface can be greatly curtailed by establishing negative capillarity along the baffle faces. This negative capillarity can be accomplished by coating the faces of the baffle elements with a material exhibiting limiting wettability with respect to the electrolyte bath, such as polytetrafluoroethylene.

However, the process of this invention allows the depositing of gold selectively on the pin shank for connection to a board, and on the head or base of the pin for obtaining an ideal solder fillet, while having these two metal coated areas separated by a non-wettable (no gold) surface.

Furthermore, this invention is amenable to masking an area of a three dimensional member, whereas other techniques are only practical with a two dimensional plane or surface.

PURPOSES AND SUMMARY OF THE INVENTION

This invention is a novel method for selective coating or plating of a member, and a member obtained by this novel method.

Therefore, one purpose of this invention is to provide an apparatus, material and a method that will selectively deposit wettable material at the desired or selective areas or locations.

Another purpose of this invention is to provide an I/O pin that can be brazed or soldered with low stress solders.

Still another purpose of this invention is to make a low cost alternative to the sputtered I/O pins.

Yet another purpose of this invention is to provide two adjacent wettable and non-wettable surfaces or areas.

In one aspect this invention comprises a method of selectively coating a member having a shank, wherein the method comprises the steps of:

a) taking a securable washer and loosely sliding said washer onto said shank of said member to be coated, b) securing said washer in order to cause said washer to be in intimate contact with said shank, c) immersing at least a portion of said member in at least one coating bath, and d) thereby selectively coating said member having a shank with at least one coating material, and wherein the portion of said shank in contact with said washer is not coated with said coating material.

In another aspect this invention comprises a selectively coated member comprising at least three zones, wherein at least a first zone having at least one securable washer secured thereto separates at least a second zone from at least a third zone, and wherein at least a portion of said second zone and/or at least a portion of said third zone has at least one coating of a coating material, and wherein said first zone is uncoated.

In yet another aspect this invention comprises a selectively coated input/output pin comprising a base, a tapered portion and a shank, wherein at least a portion of said shank has a securable washer secured thereto and wherein at least a portion of said pin has a coating of a coating material, and wherein said shank portion secured to said securable washer is uncoated.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
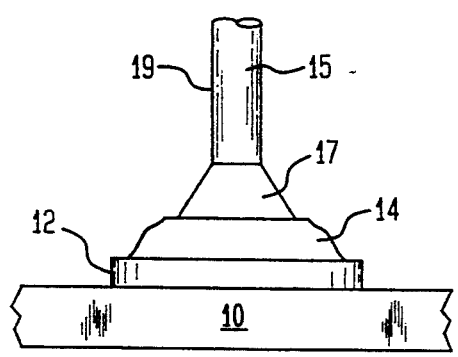
FIG. 1, illustrates a cross-sectional view of a prior art I/O pin secured to a semiconductor substrate.
Figure 2:
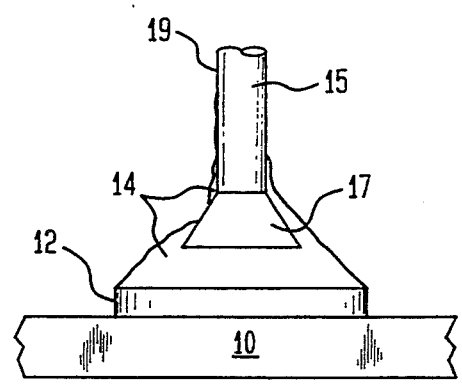
FIG. 2, illustrates a cross-sectional view of another prior art I/O pin secured to a semiconductor substrate.
Figure 3:
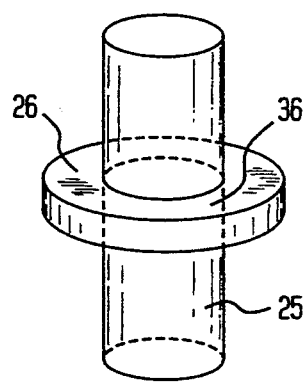
FIG. 3, illustrates a perspective view of one embodiment of the present invention with the securable washer secured to the member.

FIG. 3, illustrates a perspective view of one embodiment of the present invention with a securable ring or washer 26, such as a heat shrinkable washer, is secured to a member 25. As shown in FIG. 3, a pre-punched securable washer or gasket 26, preferably made from a polymer material is slid onto the member 25, that will be selectively coated or plated. It is preferred that the washer of gasket 26, is of a heat shrinkable material. The member to be selectively coated or plated 25, can be of any shape or size, and therefore the pre-punched securable washer or gasket 26, needs to be able to accommodate the physical requirements of the member 25. Typically, the pre-punched washer or gasket 26, is placed on a special fixture with openings to accommodate the washer 26. The fixture is then vibrated until all the washers 26, have slid into their respective openings in the fixture. Using this special fixture the washer 26, is then slid onto the shank or stem of the member 25, until the washer 26, has been moved to its desired or appropriate location along the member 25.

In order to insure that the washer 26, does not further move, the washer 26, could be secured in its desired position by means well known in the art, such as using a heat treatment. This process typically involves placing the member 25, along with the washer 26, in a thermal environment and shrinking the washer 26, onto the shank or the stem of the member 25. Of course there are other ways to achieve the same results, one of them would be to bond the washer 26, onto the member 25.

The member 25, with the washer 26, secured thereto is then partially or wholly immersed in a selective coating bath, such as a plating bath, and material 28, is allowed to be coated or plated onto the desired area of the member 25. A typical plating bath would be a gold plating bath, and gold would then be allowed to be plated onto the desired area. Care should be taken that only the area to be plated is dipped or immersed in the plating bath and only that area is allowed to get plated. Of course if the whole member, except the area protected by the washer 26, is to be coated or plated then the whole member 25, would have to be immersed into the plating or coating bath. It should also be appreciated that for some applications the washer or gasket 26, could act as a plating or coating stop. The plating technique could be selected from a group comprising electrolytic plating or electroless plating, to name a few.

After one or more coats of the desired plating material 28, have been applied onto the member 25, the washer 26, could be left on the shank or stem of the member 25, or it could be removed by methods well known in the art.

Figure 4:
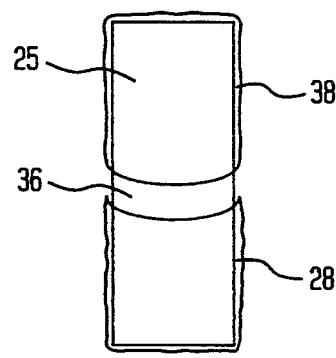
FIG. 4, illustrates a cross-sectional view of another embodiment of the present invention with the securable washer removed from the member.

FIG. 4, illustrates a cross-sectional view of an embodiment of the present invention where the member 25, has at least one coating of plated material 28, and with the securable washer 26, removed. The member 25, could also have a coating or plating of one or more coating or plating material 38. The material 38, could be the same as material 28, or they could be different. The area 36, is the uncoated area of member 25, as it was protected from the coating material 28 and/or 38, by the washer 26.

Figure 5:
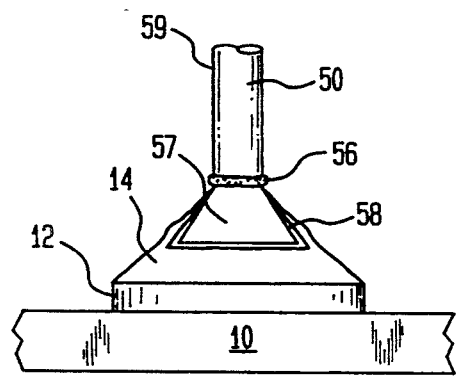
FIG. 5, illustrates a cross-sectional view of still another embodiment of the present invention with the securable washer secured to an I/O pin on a semiconductor substrate.

FIG. 5, illustrates a cross-sectional view of an embodiment of the present invention with a securable washer 56, secured to an I/O pin or electrical member 50, on a semiconductor substrate 10. Selective surface plating on I/O pin 50, was obtained by inserting the pin shank 59, through a prepunched washer 56, such as a polymer washer 56, and the polymer washer 56, was heat shrunk around the pin shank 59. The selected polymer, thermoplastic or thermosetting, is intrinsically shrinked to the molecular level as the interlocked stresses inherent within the washer's flat shape are completely released as the polymer material changes to a solid spherical shape (rheology flow). It was noticed that the polymer washer 56, after the heat or thermal treatment formed a tube-type or donut shape around the pin shank 59, which indicated that the polymer had tenaciously adhered at maximum molecular compressive forces to the pin shank, which in turn would block any coating or plating solution from penetrating at the washer-member interface.

The pin-polymer washer assembly was then completely immersed in a plating solution, such as a gold plating solution, and, gold would be allowed to be plated onto the exposed portion of the pin, i.e., on both the shank portion as well as the pin head portion. Of course the washer 56, prevented any coating or plating of material at the pin-washer area or location. Care must be taken to insure that the material used for plating or coating the pin shank and/or head does not interact with the washer material or has any adverse effect on the washer.

Figure 6:
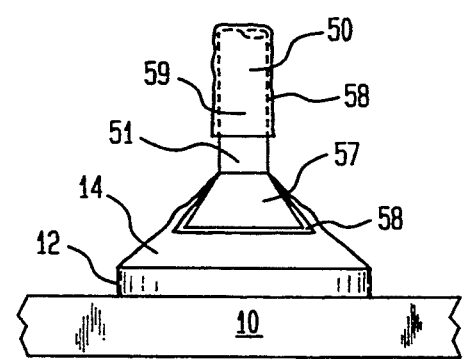
FIG. 6, illustrates a cross-sectional view of yet another embodiment of the present invention with the securable washer removed from an I/O pin on a semiconductor substrate.

FIG. 6, illustrates a cross-sectional view of an embodiment of the present invention, where the securable washer 56, has been removed from the I/O pin 50, and the pin 50, has been secured to a semiconductor substrate 10, by means well known in the art. The polymer washer 56, once removed shows or exposes the isolated non-wettable metal surface or area 51. The area 51, is basically the uncoated or unplated region of the pin or electrical member 50. Of course for some applications it may be proper to coat the complete pin or member 50, and then remove coating material from the undesired locations. This removal of coating material from the undesired locations could be done methods well known in the art, such as using a solvent or using some mechanical type means such as filing the material away. However, for some applications it may be desirous to coat the complete pin or member 50, as long as the coating material does not degrade or have an adverse effect on the required performance or application of the member 50. For such applications the method of this invention would be used after the initial one or more coats on the pin or member 50. In some applications it may be necessary to provide the pin or member 50, with a base coat so that any subsequent coating that is done provides an effective adhesion or bond to the pin or member 50. The isolated non-wettable metal surface 51, of course is desired for some applications as it prevents the solder or braze from climbing up the shank 59, while allowing the braze or solder material 14, to form an appropriate solder or braze 14, over the tapered portion of the pin head 57.

It is well known in the art that an ideal braze or solder fillet 14, around an I/O pin base or head 57, is obtained only when the tapered side of the pin 50, is properly wetted by the braze or solder; thus, the deposition of an appropriate amount or layer of a solder or braze wettable material, such as gold, on the tapered portion of the pin head 57, is very important.

Polymer special rheology has shown that the flat circular washer 56, changed into a solid tube as the polymer shrunk to its maximum molecular level and with high surface tension when it was exposed to thermal energy (heat).

A wide variety of metals, such as, aluminum, copper, iron, nickel, gold, silver or palladium, to name a few, can be used as the coating or plating material 28 and 58, for the member 25, or pin 50, respectively.

Similarly, the member 25, or pin 50, could be made from a material selected from a group comprising aluminum, copper, iron, nickel, gold, silver or palladium, to name a few.

Furthermore, the member 25, or the pin 50, can be of any size, shape or form, and of course the securable washer 26, or 56, would have to appropriately match the size, shape and form of the member 25, or the pin 50.

The polymer or the securable ring or washer that is used with a member must be of a material that is not only compatible with the material of the member, but also with the plating solutions used, so that there is no adverse effect during the plating process, such as, the ring or washer getting plated or getting dissolved, etc., during the plating or coating process.

Presently, the securable washer material is available in sheet form, with different thicknesses, size and quality. Furthermore, the punching tools to punch or form polymer washers of different shapes and sizes and are also available.

U.S. Pat. No. 4,970,570, assigned to the assignee of the present invention and incorporated herein by reference, discloses input/output pins that could be used with this invention.

This invention has shown that a member, such as an I/O pin, can be selectively coated or plated in one immersion operation, and that the desired metal, such as gold, can be deposited not only on the shank of the pin but also on the tapered side of the pin.

This invention lends itself to the mass production of low cost I/O pins that are needed. This invention also allows the selective plating on pins, and similar such members.

In a typical connector or pin of this type, one or both ends of the member or pin are open to receive the heat shrinkable material. The member or pin is then heated, causing the heat shrinkable material (HSM) or sleeve to shrink and firmly grip the electrical conductor. The sleeve or heat shrinkable material also acts to contain the movement of the coating material so that a good metallic joint is assured.

In general, such member or sleeve are made of a material capable of having the property of plastic or elastic memory imparted thereto and are normally expanded under heat and pressure to a diameter greater than their normal diameter and normally cooled while under pressure. A sleeve treated in this manner will retain its expanded position until it is again heated to above its heat-recovery temperature at which time it will recover to its original shape. Examples of material useful in forming such dimensionally heat-unstable recoverable members may be found in Currie U.S. Pat. No. 2,027,962 and Cook et al. U.S. Pat. No. 3,086,242, the disclosures of which are incorporated herein by reference. Polymeric materials which have been cross-linked by chemical means or by irradiation, for example, with high-energy electrons or nuclear radiation, such as those disclosed in the Cook et al. patent, may be used with this present invention. Noncrystalline polymeric materials exhibiting the property of plastic or elastic memory, such as polyurethane, isomers, etc, could also be used in practicing the present invention. The connector of the present invention is equally useful with sleeves made from materials having either plastic or elastic memory; consequently, as used herein, the terms "elastic memory" and "plastic memory" are used interchangeably and are intended to be mutually inclusive.

The advantages of the present invention will become more apparent after referring to the following example.

EXAMPLE

The following example is intended to further illustrate the invention and is not intended to limit the scope of the invention in any manner.

Approximately 2000 I/O pins in two separate experiments were plated selectively with gold using the process of this invention. The intrinsic molecular shrinkage of the polymer occurred right at the glass transition temperature (Tg) of the polymer; thus, a cohesive sphere was obtained before the melting point of polymer was reached. It was found that excessive polymer flow was a function of temperature and surface wettability of the substrate on which the polymer was in contact. In this invention the surface on which the polymer was adhered was a nickel I/O pin and the polymer used was ULTEM DL 1648, a polyetherimide electronic grade polymer made and Trademarked by General Electric Corporation. Temperature profile parameters were preset to obtain a gradual softening point of the polymer and shrinkage progression was set to maximize compressive forces around the pin shank for simultaneous bonding.

Immersion Au was used in this study because that was the required metallurgy for pin brazing. The temperature of the plating bath during the Au immersion operation was maintained at about 90° C. The sample plating bath was gold.

All the pins that were plated with gold met or exceeded the desired results, i.e., they all had a well defined coating of gold at the base and tapered portion of the I/O pin head, a well defined coating of gold on the pin shank, and a well defined non-gold coated area at the junction of the pin taper and the pin shank, which area of course had been properly protected by the polymer washer or ring. The non-gold coated area of the I/O pin exposed the material of the pin, which was nickel. Of course if the pin has prior coating of one or more other materials prior to the insertion of the securable washer, then of course during the subsequent coating or plating process the securable washer would protect the prior coating from being re-coated. The nickel that was exposed after the removal of the securable washer is non-wettable by the solder or braze that was used and therefore during the subsequent joining of the pin to the semiconductor substrate an ideal fillet profile was obtained.

ALTERNATIVE METHOD

An alternative way of making the special I/O pins of this invention would be by using an expensive sputtering process. The process involves doing selective gold deposition by employing a double sputtering operations. In the first sputtering operation the shank of the I/O pin would be coated with a gold layer, and in the second sputtering operation the base of the I/O pin would be coated with a gold layer. However, the present sputtering techniques do not provide a good coating of a gold layer on the tapered side of the I/O pin. Therefore, when this I/O pin is secured to a semiconductor substrate the solder or braze only wets the base and not the tapered side walls of the pin base. This type of special I/O pins would be acceptable for some applications, but for others it is desirable to have a coating of gold or similar such material also on the tapered side of the I/O pin.

The sputtering process that may be used is not conducive to depositing gold on the tapered pin side; therefore, the solder fillet around a soldered pin will be always poor and the pin pull strength can be relatively low.

Of course the sputtering process would be very expensive, due to the fact that it requires two separate sputtering steps, small batch size and in some cases a gold stripping step.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of selectively coating a member having a shank, wherein the method comprises the steps of:
    a) taking a securable washer and loosely sliding said washer onto said shank of said member to be coated,
    b) securing said washer in order to cause said washer to be in intimate contact with said shank,
    c) immersing at least a portion of said member in at least one coating bath, and
    d) thereby selectively coating said member having a shank with at least one coating material, and wherein the portion of said shank in contact with said washer is not coated with said coating material.

2. The method of claim 1, further comprising the step of removing said washer from said shank.

3. The method of claim 2, wherein said securable washer is removed using a solvent.

4. The method of claim 1, wherein said member is made of a material selected from the group consisting of aluminum, copper, iron, nickel, gold, silver and palladium.

5. The method of claim 1, wherein said coating material is selected from the group consisting of aluminum, copper, iron, nickel, gold, silver and palladium.

6. The method of claim 1, wherein said securable washer is made of a material selected from the group consisting of polytetrafluoroethylene, polyurethane and polyetherimide.

7. The method of claim 1, wherein said member is an input/output pin.

8. The method of claim 1, wherein step c) is repeated at least once to provide at least one additional coating to said member.

9. The method of claim 1, wherein said securable washer is a heat shrinkable washer.

10. The method of claim 1, wherein said member is an input/output pin having a shank and said securable washer is secured to at least a portion of said shank.

11. The method of claim 1, wherein said securable washer is made of a polymeric material.

12. The method of claim 1, wherein said securable washer is made of an isomeric material.

* * * * *